(12) United States Patent
Fisher et al.

(10) Patent No.: US 6,346,304 B1
(45) Date of Patent: *Feb. 12, 2002

(54) DENSIFICATION OF A POROUS STRUCTURE (II)

(75) Inventors: Ronald Fisher, Warwickshire; Keith Williams, Coventry, both of (GB)

(73) Assignee: Dunlop Limited, Coventry (GB)

( * ) Notice: Subject to any disclaimer, the term of this patent is extended or adjusted under 35 U.S.C. 154(b) by 0 days.

This patent is subject to a terminal disclaimer.

(21) Appl. No.: 09/202,692

(22) PCT Filed: Jun. 20, 1997

(86) PCT No.: PCT/GB97/01685

§ 371 Date: Dec. 21, 1998

§ 102(e) Date: Dec. 21, 1998

(87) PCT Pub. No.: WO97/48661

PCT Pub. Date: Dec. 24, 1997

(30) Foreign Application Priority Data

Jun. 20, 1996 (GB) .............................. 9612882

(51) Int. Cl.⁷ .................. C23C 16/00; C23C 16/26; C23C 16/46

(52) U.S. Cl. ................. 427/595; 427/249.2; 427/249.4; 427/255.12

(58) Field of Search .............................. 427/595, 249.2, 427/249.4, 255, 12, 900; 428/113, 317.9, 319.1; 188/73.2, 218 XL, 71.1

(56) References Cited

U.S. PATENT DOCUMENTS

| | | | |
|---|---|---|---|
| 3,991,248 A | * 11/1976 | Bauer | .......................... 427/245 |
| 4,457,967 A | * 7/1984 | Chareire et al. | ............. 428/212 |
| 4,472,454 A | 9/1984 | Houdayer et al. | |
| 4,580,524 A | 4/1986 | Lackey, Jr. et al. | |
| 4,976,899 A | 12/1990 | Rousseau et al. | |
| 5,348,774 A | * 9/1994 | Golecki et al. | ............. 427/543 |
| 5,389,767 A | 2/1995 | Dobry | |
| 5,412,185 A | 5/1995 | Sturman, Jr. et al. | |
| 5,547,717 A | * 8/1996 | Scaringella et al. | ......... 427/590 |
| 5,665,464 A | * 9/1997 | Takayasu et al. | ......... 428/312.2 |
| 5,789,026 A | * 8/1998 | Delperier et al. | ............ 427/249 |
| 5,869,411 A | * 2/1999 | Bazshushtari et al. | ...... 442/340 |
| 6,177,146 B1 | * 1/2001 | Fisher et al. | ................. 427/544 |
| 6,180,223 B1 | * 1/2001 | Fisher et al. | ............. 428/317.9 |

FOREIGN PATENT DOCUMENTS

| | | |
|---|---|---|
| EP | 503794 A1 | 9/1992 |
| EP | 0 592 239 | 4/1994 |
| GB | 1221852 | 2/1971 |
| GB | 2130567 | 6/1984 |
| GB | 2268485 | 6/1994 |
| JP | 3-64475 | 3/1991 |
| WO | WO94/24837 | 10/1994 |

* cited by examiner

*Primary Examiner*—Michael Barr
(74) *Attorney, Agent, or Firm*—Young & Thompson

(57) ABSTRACT

At least one layer of fibers of a material susceptible to heating by electromagnetic radiation is incorporated in a porous structure. The structure is subjected to the radiation to heat up the body which is contacted with hydrocarbon gas to cause the gas to deposit carbon within the porous structure and thereby cause densification.

24 Claims, 1 Drawing Sheet

DENSIFICATION OF A POROUS STRUCTURE (II)

FIELD OF THE INVENTION

This invention relates to a method for the densification of a porous structure, a porous structure for densification by the method of the invention and a densified structure, such as a friction element for an aircraft brake, formed by the method of the invention.

The invention relates generally but not exclusively to the infiltration and densification of a porous structure, such as a carbon fiber or ceramic structure, which may be shaped as a preform for a finished product or for use in providing a finished product.

BACKGROUND OF THE INVENTION

It is known that in the manufacture of a carbon-carbon composite product, such as a brake friction element, a porous preform body, which may have approximately the desired shape and dimensions of the finished product, may be densified by a method which involves chemical vapor infiltration and deposition. The carbon-carbon composite product so formed has many useful attributes, including high strength and frictional wear resistance, but the use of such structures is limited by high costs which arise because of the slowness of the manufacturing method. Similar considerations arise in relation to the manufacture and use of other, ceramic matrix composites.

Carbon-carbon composites often are manufactured by the isothermal, isobaric chemical vapor infiltration (CVI) procedure whereby a hydrocarbon gas is caused to diffuse into a porous carbon fiber preform body and deposit carbon. To obtain a high final density and a desired microstructure the diffusion and deposition process is performed in a high temperature environment at a low pressure and takes a considerable period of time, for example typically between 500 and 2000 hours.

It is known that the rate of infiltration and deposition may be accelerated by a so-called thermal gradient technique. A temperature gradient is established within a preform and a front of deposition moves through the preform, starting at the hottest region and moving away progressively with increasing densification of the hottest region. The thermal gradient technique is discussed in U.S. Pat. No. 5,348,774 (Golecki et. al.) which describes a method of achieving a thermal gradient by the electromagnetic heating of a graphite core provided as a close fit in the bore of a porous preform body of annular shape.

Although the thermal gradient technique can accelerate the rate of infiltration and deposition, it requires the use of special equipment and process control procedures the cost of which tends to offset savings from the reduction of processing time.

Another prior art method and apparatus for densification of a porous body is described in EP O 592 239 A2. In contrast to the use of a vapor for densification, as described in U.S. Pat. No. 5,348,774, the teaching of this publication relates to the use of a liquid for densification.

SUMMARY OF THE INVENTION

An object of the present invention is to provide an improved method for the densification of a porous structure, a porous structure for densification by the method of the invention and a densified structure formed by the method of the invention.

In accordances with one of Its aspects the present invention provides a method for the densification of a porous structure comprising providing the structure with a body of a material which includes a susceptor element comprising fibers of a material which is more susceptible to heating by electromagnetic radiation than the material of the body, exposing said porous structure to hydrocarbon gas and simultaneously applying an electromagnetic field to said porous structure whereby said susceptor element at least in part causes heating of the porous structure to a temperature at which the gas infiltrating the porous structure deposits carbon within the porous structure.

The present invention provides also a porous structure for densification by chemical vapor infiltration, said porous structure comprising a body which includes a susceptor element comprising fibers of a material which is more susceptible to heating by electromagnetic radiation than the material of the body, said susceptor element being positioned and arranged whereby when exposed to an electromagnetic field at least in part it causes heating of the porous structure to a temperature at which the gas infiltrating the porous structure deposits carbon within the porous structure.

The term fibers as used herein includes so-called staple fibers having a length to diameter (or width) ratio of less than 10:1, and also long length fibers, known as filaments. The fibers may be in the form of individual filaments or groups of filaments which may be twisted together, i e as yarns, tows or cords.

The susceptor element may comprise fibers of good electrical conductivity as hereinafter defined. It may be of a material which remains in the composite porous structure following densification, or it may be a material which is removed, for example by heating and melting or evaporating, or by cutting and/or machining of the composite structure.

The fibers of the susceptor element may be individually dispersed within the porous body or a plurality of fibers may be integrated, for example as a woven or non-woven fabric layer, which is then incorporated within the porous body. Whether individually dispersed or incorporated in at least one fabric layer, the susceptor element material may be selectively positioned so that susceptor element material is present to a greater extent in one part of the porous body than in the remainder or another part of the porous body.

In the case of a porous structure of annular form it is taught by the present invention that a susceptor element of fibers integrated as a layer may also be of annular shape and incorporated in the porous structure such that the susceptor element and porous structure are substantially concentric. The or at least one susceptor element layer may be positioned to lie substantially centrally between radially inner and radially outer extremities of the porous structure and/or substantially centrally between annular end faces of the porous structure.

The or each layer of susceptor element fibers preferably has a thickness less than 2.0 mm, preferably 1.0 mm or less. It is further preferred that in the case of a porous structure formed from cloth layers, the ratio of the thickness of a layer of susceptor element material to the thickness of each cloth layer is not greater than 3:1, preferably less than 1.5:1, and more preferably less than or equal to 1:1.

If the susceptor element is to remain in the composite structure following densification, preferably it and other materials of the structure are selected to be materials which do not degrade or react with one another.

Although the invention teaches that, for fibers integrated in a fabric layer, only a single susceptor element layer need be incorporated in the porous structure, it is envisaged that a plurality of said layers may be provided. The susceptor element layers may be arranged to lie co-planar and/or to lie in superimposed layers. Elements in superimposed layers may be directly superimposed, optionally spaced by porous structure material, and/or offset relative to one another.

The susceptor element(s) may be arranged within the porous structure to provide a substantially uniform heating effect or the element(s) may be arranged in a non-uniform manner which results in a thermal gradient. By selecting the uniformity or otherwise of the heating effect there may be achieved a pre-selected uniformity or variation of rate of carbon deposition within the porous body.

In this specification the reference to a susceptor element of good electrical conductivity means an element of a material having a resistivity, expressed in units of micro ohm m, of less than 20, preferably less than 10, and more preferably less than 5. It is preferred also that a susceptor element of good conductivity shall have a resistivity greater than 0.02, preferably greater than 0.05 and more preferably more than 0.1 micro ohm m.

The resistivity of the susceptor element material preferably is less than, more preferably less than one half, that of the porous body material.

A susceptor element of good electrical conductivity may be of a kind, such as a fiber of constant cross-section, which is uniformly heated when exposed to an electromagnetic field. Alternatively the element may be of a kind which attains a temperature gradient when exposed to an electromagnetic field, for example as a result of being of a non-uniform resistance.

The frequency of the electromagnetic field is chosen in known manner to result in preferential heating of the susceptor element(s).

The shape (and/or orientation) of a susceptor element preferably also is selected to result in a preferential/efficient heating effect. To achieve a good heating effect when using a susceptor element of good electrical conductivity it is preferred typically that the element is in the form of an electrically conductive closed loop, e.g. of an annular form.

A porous structure may incorporate a single annular susceptor element of fibers of good electrical conductivity or a plurality of said elements. A plurality of elements may be arranged superimposed in a concentric manner, or may be spaced from one another, and/or may be of different radial dimensions.

A susceptor element of fibers may be provided in combination with a susceptor element comprised by an electrically conductive foil, such as a metal foil or similar sheet material, which optionally may be of a perforated or mesh type, e.g. of good electrical conductivity.

The susceptor element may be, for example, in the form of tows which optionally may be in the form of a fabric. The fiber tows/fabric may be formed substantially only from fibers of good electrical conductivity or from a combination which includes other materials such as ceramic or carbon fibers.

If the susceptor element is of sheet type material it may comprise apertures or cut-outs that allow formation of a bond between portions of other material between which the element is sandwiched, e.g. by bridging of the matrix material or by needle punching of fibers.

Suitable materials for susceptor element fibers include graphite, steel, tungsten and molybdenum. Particular examples are Pitch Fiber P25, P55, P75, P100 and P120, (all ex-Amoco).

An example of a procedure of the present invention for the manufacture of an annular carbon-carbon composite comprises making an annular preform of PAN (polyacrylonitrile) precursor carbon fibers which are heat treated to less than graphitisation temperature, typically in the order of 1500° C., and incorporating in the preform a concentric annulus of a fabric layer of graphite fibers. When heated in a high frequency electromagnetic field the graphite fibers rapidly heat by induction while the lower electrical conductivity carbon fibers remain cool. Subsequently the carbon fibers are subject to heat by thermal conduction from the hot graphite fibers.

Typically PAN fibers may be incorporated in the porous body in the form of a 320K tow. Susceptor element fibers typically may be in the form of a 2K tow.

A porous preform may be constructed, for example, by arranging layers of fabric to be compressed in a jig, or bonding layers to one another with resin, or bonding layers with carbon or other material which will resist the temperature of deposition, or by needling together layers of fibers or fabric. The preform may be a multi-directional woven structure such as a three-dimensional woven structure.

The invention provides that in the case of carbon fiber it is possible to construct a major part of the preform from acrylic precursor fiber and to incorporate one or more loops of more graphitic, i.e. electrically conductive, fibers such as Amoco P55 or P120, which may be provided either in a fabric construction or laid between layers of the preform.

The porous structure material typically may have a thermal conductivity of less than 20 $Wm^{-1}K^{-1}$, a preferred range being 8 to 15 $Wm^{-1}K^{-1}$. The susceptor element fibers may have a thermal conductivity of greater than 50 $Wm^{-1}K^{-1}$. Preferably the conductivity is greater than 100 $Wm^{-1}K^{-1}$. Preferably the ratio between the thermal conductivity of the material of the susceptor element(s) and that of the porous structure is at least 5:1, more preferably at least 10:1.

The susceptor element fibers preferably occupy less than 5% of the volume of the porous body, more preferably less than 1%, and even more preferably less than 0.5%.

As understood by those skilled in the art, there is a range of gases, liquids or vapors which can be used as the depositing medium. For carbon deposition a readily available and low cost medium is natural gas or methane, but any hydrocarbon may be used. Examples of materials for the deposition of silicon carbide, e.g. methyl trichlorosilane, are well known. In a technique described in U.S. Pat. No. 4,472,454 an annular carbon fiber preform is immersed in a liquid hydrocarbon and electromagnetic heating is employed in combination with a cylindrical susceptor which comprises a graphite mandrel arranged to extend within and to be in thermal contact with the bore of the preform. By use of a preform of a kind provided by the present invention it is possible to eliminate the need for a close-fitting graphite mandrel and the limitations which that imposes.

The invention is advantageous for the manufacture of a product such as an aircraft carbon composite brake disc which is required to be especially strong at an edge region, such as a notched edge which can engage keyways for the transmission of braking torque. The invention provides an efficient route for achieving a high density in an edge region.

BRIEF DESCRIPTION OF THE DRAWINGS

An embodiment of the invention as applied to an aircraft brake disc is now described by way of example only, reference being made to the drawings, in which.

DETAILED DESCRIPTION OF THE PREFERRED EMBODIMENT

Figure 1:
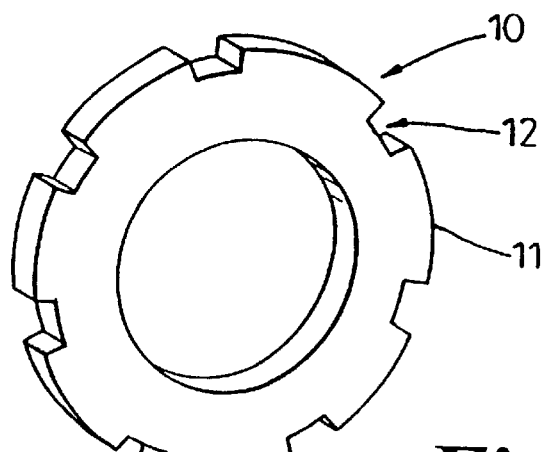
FIG. 1 is a perspective view of a brake disc.

An aircraft brake disc 10 as shown in FIG. 1 has an outer edge 11 provided with circumferentially spaced notches 12 for engaging with the internal splines of an aircraft wheel. The present invention teaches that in the example of this particular embodiment the edge region 11 is to be given a higher density than other parts of the disc by providing that in a preform for manufacture of the disc that region shall have a greater proportion of elements of good electrical conductivity than other parts of the disc. The higher density at the edge region 11 results in a higher strength which is needed for transmission of torque loads.

Figure 2:
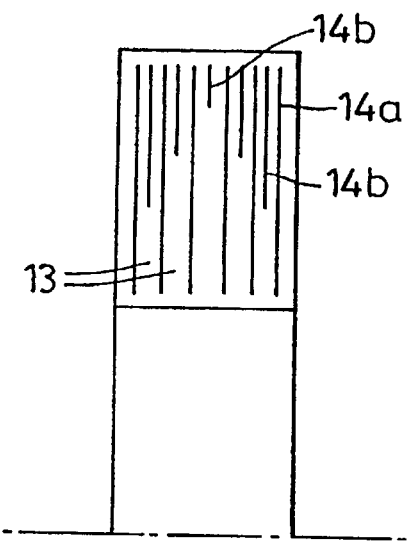
FIG. 2 is a transverse section of part of a preform for the disc of FIG. 1.
Figure 3:
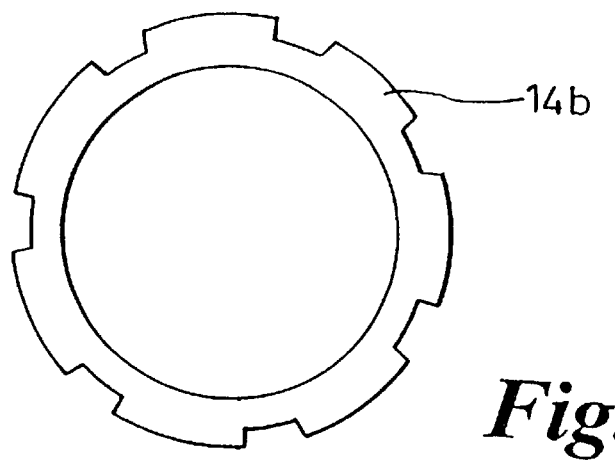
FIG. 3 is a side view of a component layer of the preform of FIG. 2.

The preform for the disc 10 comprises layers of carbon fiber preform material 13 (see FIG. 2) of known kind and which conventionally has a low electrical conductivity. That material incorporates susceptor element fabric layers 14 formed from graphite fibers, some layers 14a extending between inner and outer radial edges of the disc preform and alternating with other graphite fiber layers 14b which lie only at a radially outer edge. For the manufacture of a disc which is pre-formed with notches, or which has lower density regions for removal by machining to form notches, the graphite layers have notched outer profiles as shown by FIG. 3.

Following electromagnetic heating of the susceptor element layers during a carbon infiltration and densification process the resulting disc has greater strength in the notched drive regions, and that can be achieved without adversely affecting the desired physical properties of the disc friction surfaces. The use of the good electrically conductive material within the preform allows heat to be generated within the preform instead of being conducted to the preform. This results in a beneficial reduction of manufacturing time and cost.

In some applications it may be preferred to avoid a high densification at edge regions, in which case the susceptor material is positioned primarily at positions remote from the edges.

The invention has been illustrated in the context of a rotor disc but may be applied also to the manufacture of a stator disc.

The invention allows for better control of deposition of carbon in addition to a faster deposition rate. Thus it is possible to achieve a better deposition density at the center of a preform, and to avoid the low density problems experienced at the center of thick preforms as seen with isothermal, isobaric carbon vapor impregnation.

The invention also allows substantial ease of flexibility in control of densification so as to achieve a desired thermal gradient deposition appropriate to a specific product requirement.

What is claimed is:

1. Method for the densification of a porous structure formed of a body of a material, the method comprising the steps of:

locating an element within the body, the element comprising fibers integrated as a layer of a material which is more susceptible to heating by electromagnetic radiation than the material of the body;

exposing the body containing the element to hydrocarbon gas; and simultaneously, with the exposing step, applying an electromagnetic field, wherein the element at least in part causes heating of the body to a temperature at which the hydrocarbon gas infiltrating the porous structure deposits carbon within the porous structure, and wherein the layer has a thickness less than 2.0 mm.

2. Method according to claim 1 wherein the layer has a thickness less than 1.0 mm.

3. Method according to claim 1, wherein the porous structure body comprises layers of cloth.

4. Method according to claim 3, wherein the element is in the form of layers of one or more fibers and the ratio of the thickness of a layer of fibers of material to the thickness of each cloth layer is not greater than 3:1.

5. Method according to claim 4, wherein the ratio is less than 1.5:1.

6. Method according to claim 1, wherein the element fibers occupy less than 5% of the volume of the porous structure.

7. Method according to claim 6, wherein the fibers occupy less than 1% of the volume of the porous structure.

8. Method according to claim 7, wherein the fibers occupy less than 0.5% of the volume of the porous structure.

9. Method according to claim 1, wherein the element layer is of annular shape and lies substantially centrally between radially inner and outer extremities of the porous structure.

10. Method according to claim 1, wherein the element comprises the fibers integrated as a layer in combination with an electrically conductive foil that also acts as the element.

11. Method according to claim 1, including the step of removing the element after the densification.

12. Method for the densification of a porous structure formed of a body of a material, the method comprising the steps of:

locating an element within the body, the element comprising fibers of a material which is more susceptible to heating by electromagnetic radiation than the material of the body; and then exposing the body containing the element to hydrocarbon gas; and simultaneously, with the exposing step, applying an electromagnetic field, wherein the element at least in part causes heating of the body to a temperature at which the hydrocarbon gas infiltrating the porous structure deposits carbon within the porous structure, and wherein the element fibers occupy less than 5% of the volume of the porous structure.

13. Method according to claim 12, wherein the element allows heat to be generated within the porous structure instead of being conducted to the porous structure.

14. Method according to claim 12, wherein the fibers occupy less than 1% of the volume of the porous structure.

15. Method according to claim 14, wherein the fibers occupy less than 0.5% of the volume of the porous structure.

16. Method according to claim 12, wherein the element comprises the fibers in combination with an electrically conductive foil that also acts as the element.

17. Method according to claim 12, including the step of removing the element after the densification.

18. Method for the densification of a porous structure formed of a body of a material, the method comprising the steps of:

locating an element within the body, the element comprising fibers of a material which is more susceptible to heating by electromagnetic radiation than the material of the body;

exposing the body containing the element to hydrocarbon gas; and simultaneously, with the exposing step, applying an electromagnetic field, wherein the element at least in part causes heating of the body to a temperature at which said hydrocarbon gas infiltrating the porous structure deposits carbon within the porous structure, wherein the porous structure body which contains the element fibers comprises layers of cloth, and wherein the element is in the form of layers of one or more fibers and the ratio of the thickness of a layer of fibers of material to the thickness of each cloth layer is not greater than 3:1.

19. Method according to claim 18, wherein said ratio is less than 1.5:1.

20. Method according to claim 18, wherein the element fibers occupy less than 5% of the volume of the porous structure.

21. Method according to claim 20, wherein the fibers occupy less than 1% of the volume of the porous structure.

22. Method according to claim 21, wherein the fibers occupy less than 0.5% of the volume of the porous structure.

23. Method according to claim 18, wherein the element comprises the fibers in combination with an electrically conductive foil that also acts as the element.

24. Method according to claim 18, including the step of removing the element after the densification.

* * * * *